US005798715A

United States Patent [19]

Saperstone

[11] Patent Number: 5,798,715

[45] Date of Patent: Aug. 25, 1998

[54] METHOD AND DEVICE FOR ACCESSING REMOTE CONTROL FUNCTIONS

[76] Inventor: Dorothy Luhr Saperstone, 18 Horizon Dr., Ithaca, N.Y. 14850-9770

[21] Appl. No.: 673,339

[22] Filed: Jun. 28, 1996

[51] Int. Cl.[6] .......... H03M 11/00

[52] U.S. Cl. .......... 346/22; 34/176; 400/714; 200/5 A

[58] Field of Search .......... 341/176; 200/333, 200/303, 304, 5 A; 400/714, 496; 178/17 C; 312/208.3, 293.1, 293.2, 293.3

[56] References Cited

U.S. PATENT DOCUMENTS

| | | | |
|---|---|---|---|
| D. 355,302 | 2/1995 | Eva | D3/299 |
| 1,673,724 | 6/1928 | Vickers . | |
| 4,060,163 | 11/1977 | Willingham | 178/17 C |
| 4,066,850 | 1/1978 | Heys | 200/5 A |
| 4,893,954 | 1/1990 | Kotur | 400/714 |
| 4,922,980 | 5/1990 | Parker | 150/165 |
| 5,092,459 | 3/1992 | Uljanic | 206/320 |
| 5,093,317 | 3/1992 | Phillippe | 400/714 |
| 5,096,317 | 3/1992 | Phillippe | 400/714 |
| 5,245,146 | 9/1993 | Florence | 200/333 |
| 5,316,141 | 5/1994 | Jalomo | 206/320 |
| 5,344,009 | 9/1994 | Choi | 206/305 |
| 5,383,091 | 1/1995 | Snell | 361/679 |
| 5,388,691 | 2/1995 | White | 206/305 |
| 5,401,904 | 3/1995 | Greenier | 200/333 |
| 5,419,704 | 5/1995 | North | 400/714 |
| 5,445,266 | 8/1995 | Prete | 206/320 |

OTHER PUBLICATIONS

Photographs of Akai Universal Wireless Remote Control Unit. Model No. RC–V939A.

*Primary Examiner*—Jeffery Hofsass
*Assistant Examiner*—Albert K. Wong
*Attorney, Agent, or Firm*—Cushman Darby Cushman IP Group of Pillsbury Madison & Sutro

[57] ABSTRACT

A remote control includes a cover plate formed of a single piece of rigid material. The cover plate is removably attached to the remote control and is adapted for preventing depression of a first set of buttons while permitting depression of a second set of buttons when attached to the remote. Fasteners such as Velcro are used to removably attach the cover plate to the remote control. Preferably, the cover plate is flat and comprised of metal or plastic so that it can be cost-effectively made and easily adapted for use with a variety of types of remotes.

34 Claims, 2 Drawing Sheets

FIG. 6
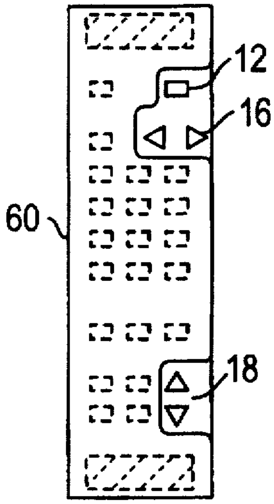
FIG. 7
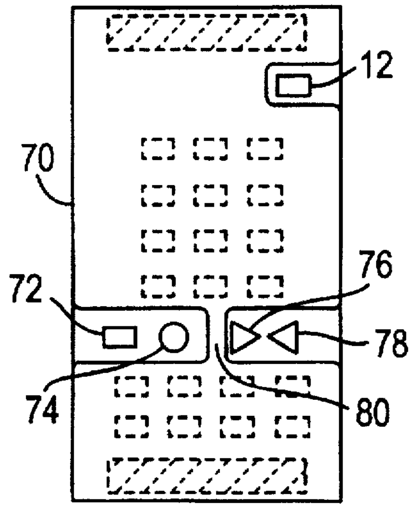
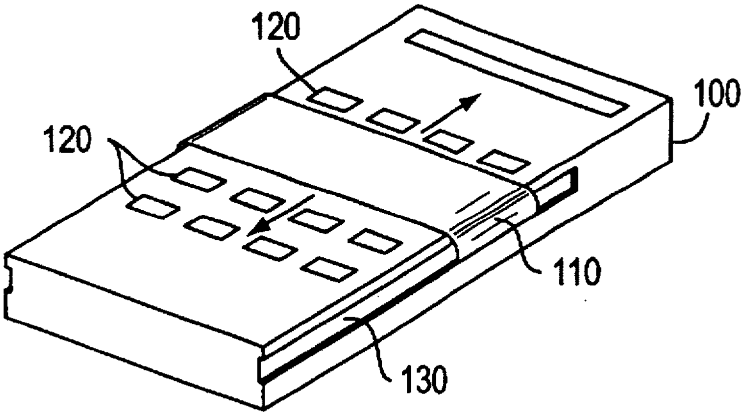
FIG. 8A
PRIOR ART
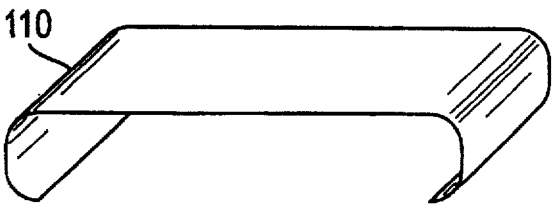
FIG. 8B
PRIOR ART

METHOD AND DEVICE FOR ACCESSING REMOTE CONTROL FUNCTIONS

BACKGROUND OF THE INVENTION

1. Field of the Invention

The present invention relates to a remote control for an electronic device, and more particularly, to a method and device for selectively and conveniently accessing sets of remote control functions.

2. Description of the Related Art

Remote controls are ubiquitous and have greatly added to the comfort and convenience of the average consumer of electronic devices such as televisions, VCRs, stereos and the like.

Persons with handicaps and the elderly are particularly dependent on remote controls. However, not all remote controls are designed with the needs of such persons in mind. Often the writing on desired buttons is small and difficult to read, making them difficult to locate. The spacing between buttons is often much narrower than the size of a finger, making it more likely that incorrect buttons will be pressed. Therefore, remotes with many small buttons cause such persons to become so overwhelmed with frustration that they abandon efforts to use them. This decreases their ability to enjoy broadcast or recorded programs, and in turn decreases their quality of life.

Further, as the sophistication of electronic devices increases, so do the number and complexity of their available functions. This further adds to the confusion and difficulties outlined above, because such functions are often added as separate access keys on the remote.

Moreover, a given household may include persons both with and without handicaps. These persons have different needs and priorities regarding the use of the remote. Persons with handicaps, as well as young children, are concerned with accessing important basic functions without the need to hunt for and excessively manipulate a large number of keys. On the other hand, persons without handicaps want the entire range of functions available to them. When both persons must share the use of the same remote, their needs conflict, and usually both are dissatisfied.

These households sometimes attempt to resolve their conflicts by purchasing a second universal-type remote which includes buttons for only a minimal amount of universally-used functions. However, this adds to the proliferation of remote control units scattered around a household, not to mention the added expense of acquiring multiple transmitters for a single appliance. Moreover, the universal-type remotes usually still include unnecessary buttons such as number keys.

A remote control cover for a remote is known, as illustrated in FIGS. 8A and 8B. However, it is designed to merely to cover buttons directed to all the functions for one device, such as a VCR, while leaving exposed all the function buttons 120 directed to another device, such as television. Moreover, such 110 a cover is typically difficult to manipulate by persons with various handicaps. For instance, this known cover slides on and off the remote 100 via a thin groove 130 fashioned on the sides. A person with handicaps would not easily be able to position this cover within the groove.

Accordingly, there remains a need in the art for a remote control which satisfies the concerns and needs of household members both with and without handicaps. The present invention fulfills this need.

SUMMARY OF THE INVENTION

An object of the present invention is to provide a method and device for accessing remote control functions which overcomes the problems of the prior art.

Another object of the invention is to provide a remote control which permits persons who are elderly and who have handicaps to easily manipulate a subset of basic functions of a single device.

Another object of the invention is to provide a remote control which permits all members of a household to manipulate desired available functions.

Another object of the invention is to provide a device which is adaptable for use with a variety of off-the-shelf remote controls.

Another object of the invention is to provide a device and method for accessing remote control functions which is cost-effective and simple to fabricate.

To fulfill these and other objects, a device according to the present invention includes a cover plate formed of a single piece of rigid material. The cover plate is removably attached to the remote control and is adapted for preventing depression of a first set of buttons directed to non-basic functions of a single device while permitting depression of a second set of buttons directed to basic functions of the device when attached to the remote. Fasteners such as Velcro are used to removably attach the cover plate to the remote control and to provide a minimum clearance between the cover plate and the covered buttons. The contour of the cover plate preferably corresponds to the contour of the remote for simple manipulation and alignment. Preferably, the cover plate is flat and comprised of metal or plastic so that it can be cost-effectively made and easily adapted for use with a variety of types of remotes.

BRIEF DESCRIPTION OF THE DRAWINGS

The present invention will become better understood from the following detailed description, taken in conjunction with the attached drawings in which:

FIG. 6 illustrates a top view of a stereo remote control with a cover plate attached in accordance with the principles of the present invention;

FIG. 7 illustrates a top view of a VCR remote control with a cover plate attached in accordance with the principles of the present invention; and FIGS. 8A and 8B illustrate a conventional remote control cover for a universal-type remote control unit.

DETAILED DESCRIPTION OF THE PREFERRED EMBODIMENTS

Figure 1:
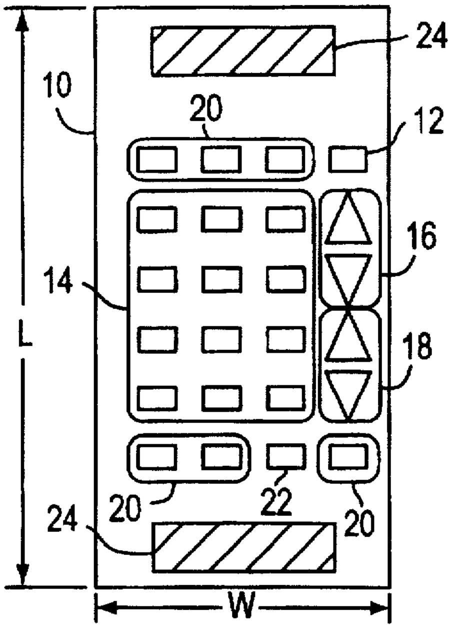
FIG. 1 illustrates a top view of a television remote control according to the present invention.

A top view of a remote control according to the present invention is shown in FIG. 1.

The remote control 10 illustrated in FIG. 1 is particularly adapted for television functions and includes a power button 12, numeric buttons 14, channel up/down buttons 16 and volume up/down buttons 18. The remote control 10 can also include programming/mode buttons 20 for selecting and controlling special functions such as muting, programming time and date, etc., and a "favorite" button 22 for selecting a favorite channel or function. The buttons are typically arranged in rows and columns to facilitate simple layout and ease of manipulation.

The remote control 10 also includes mounting strips 24 preferably attached to opposite ends of the remote control body, the purpose of which will be discussed in full detail hereinbelow. In a preferred embodiment, the mounting strips are made of Velcro and are positioned to minimize any possible interference with the buttons.

Figure 2:
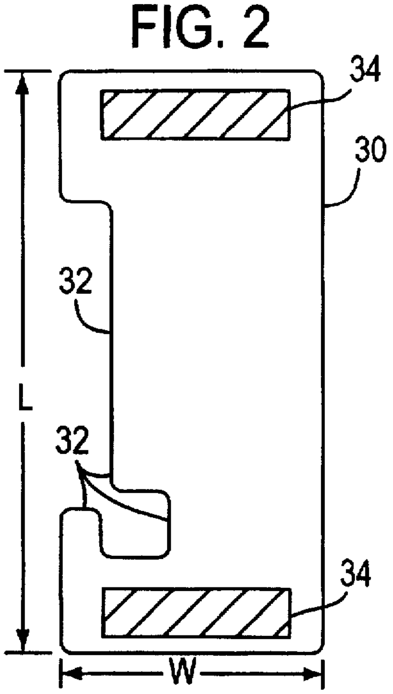
FIG. 2 illustrates a bottom view of a cover plate for a remote control such as that of FIG. 1 according to the present invention.

The bottom view of a remote control cover plate 30 according to the present invention is shown in FIG. 2. It includes a cutaway portion 32 and fasteners 34. In a preferred embodiment, the maximum outer dimensions of the cover plate do not exceed the maximum outer dimensions of the remote control, so that the unit does not become unwieldy when they are attached to each other and so that the cover plate can be easily and reliably positioned when attaching. Moreover, the fasteners 34 are positioned on the cover plate to mate completely with the mounting strips 24 so as to provide a maximum amount of coupling force.

Figure 3:
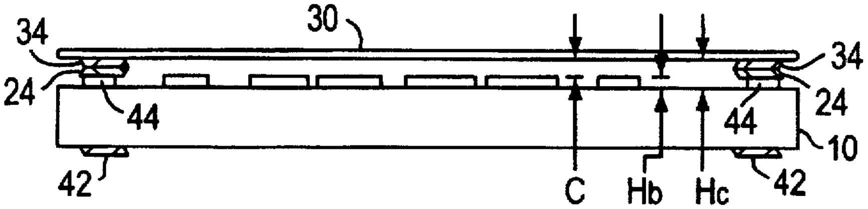
FIG. 3 illustrates a side view of a remote control of FIG. 1 with a cover plate such as that of FIG. 2 attached.

A side view of the remote control 10 with the cover plate 30 attached is shown in FIG. 3. As seen, the combined height $H_c$ of the fasteners 34 securely coupled with the mounting strips 24 provides sufficient clearance height C so that the cover plate does not contact with the buttons which have a height $H_b$. That is, $H_c \geq H_b + C$. Preferably, the cover plate 30 is made of metal, plastic, or similar rigid material so that even when gripped firmly in a hand, the covered buttons are not inadvertently depressed. However, the cover plate must be sufficiently lightweight so that the combined unit is not excessively heavy. For example, for a typical remote control which measures approximately six inches by two inches, a cover plate 30 is made of "300 Series" stainless steel having a thickness of 0.035 inches.

As seen in FIG. 3, the remote control 10 may also include storing strips 42 affixed to the bottom surface of the remote control. These are optionally included to permit the cover plate 30 to be removably attached to the remote in a storing position when not needed so that it does not become lost.

Figure 4:
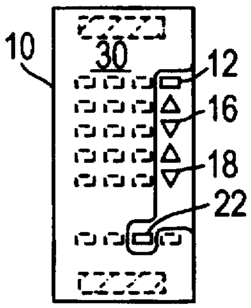
FIG. 4 illustrates a top view of a remote control of FIG. 1 with a cover plate such as that of FIG. 2 attached in accordance with a preferred embodiment of the present invention.

As seen in FIG. 4, according to one embodiment of the invention, the cutaway portions 32 are fashioned and positioned for television viewing so that the power button 12, the channel up/down buttons 16, the volume up/down buttons 18 and the "favorite" button 22 are exposed when the cover plate 30 is attached to the remote control 10. FIG. 4 is a top view showing these buttons exposed through the cutaway portions 32 in the remote control cover plate 30.

Figure 5:
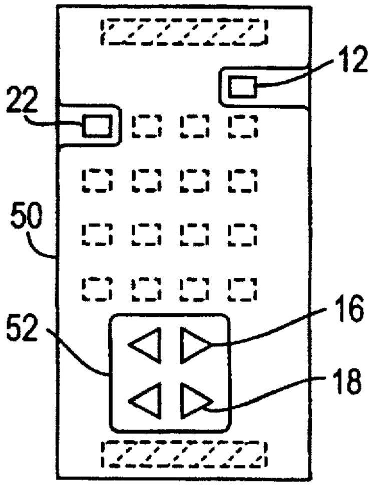
FIG. 5 illustrates a top view of an alternative television remote control with a cover plate attached in accordance with the principles of the present invention.

FIG. 5 shows a different television remote control 50 having a different button layout than the remote control of FIG. 1. In this layout, the desired buttons are not all located in the same position along one edge of the remote control, but are dispersed in different locations.

FIG. 6 shows a stereo remote control 60 according to the principles of the invention. In this remote, the power button 12, channel/program up/down buttons 16, and volume up/down buttons 18 are preferably exposed.

FIG. 7 shows a VCR remote control 70 according to the principles of the invention. In this remote, the power button 12, tape stop 72, play 74, fast forward 76, and reverse 78 buttons are preferably exposed.

Although each of the illustrated remote controls has a rectangular shape, it should be apparent that the principles of the invention are not limited to this shape, but can include other shapes and contours, such as teardrop-shaped remote controls.

A method of adapting an off-the-shelf remote control will now be described with reference to the attached drawings.

First, a remote control such as the remote control 10 in FIG. 1 is obtained and its outer dimensions measured.

Next, the buttons which correspond to the power button 12, the channel up/down buttons 16, the volume up/down buttons 18 and perhaps a "favorite" button 22 are located. From the positions of these keys, the locations of the cutaway portions 32 can be determined.

A piece of rigid material is obtained and first fashioned to match the outer dimensions of the identified remote control. Then, cutaway portions 32 corresponding to the selected buttons are fashioned using a saw or similar equipment. Care must be taken to align the cutaway portions so that they will expose the selected buttons when the edges of the resulting cover plate 30 are aligned with the edges of the remote.

If the buttons are toward the side of the remote control, only a single cutaway portion 32 may be necessary, as in FIG. 4. However, if the buttons are located in the middle of the remote, multiple cutouts 52 such as those in FIG. 5 may be required. Furthermore, if buttons are located in a single row across the entire width of the remote, a pillar portion 80 may be required in order to maintain the rigidity of the cover plate such as that illustrated in FIG. 7.

Next, fastening material 24 is applied to selected positions on the remote control 10. These positions should be determined such that maximum rigidity of the cover plate will be achieved. However, the fastening material should not interfere with normal use of the remote when the cover plate is not attached. For this purpose, Velcro is preferred, and should be placed approximately ¼ of an inch from the nearest buttons on the remote. The Velcro is cut into strips preferably covering the unused portions at opposite ends of the front surface of the remote control 10. Although Velcro is preferred, other fasteners such as snaps could be used.

Next, the mating portion 34 of the fastening material is affixed to the cover plate 30. Care should also be taken in this step to properly align the mating portions with the material on the remote control. Before affixing the fastening material, it should be verified that the combined thickness $H_c$ of the fasteners will provide sufficient clearance C between the cover plate and the buttons. If not, spacers 44 (made of plastic or the like) may be interposed between the fastening material and either the cover plate or remote control (as shown) in order to shim up the clearance C.

Although the present invention has been described with reference to the preferred embodiments thereof, those skilled in the art will readily appreciate that various substitutions and modifications can be made thereto without departing from the spirit and scope of the invention as set forth in the appended claims.

What is claimed is:

1. A device which is adapted for use in a remote control having a plurality of buttons for accessing remote control functions, said buttons disposed on a front surface having a predetermined shape, said device comprising:

a cover having a shape substantially corresponding to said shape of said front surface of said remote control which is adapted to prevent depression of a first set of said buttons and to permit depression of a second set of said buttons different than said first set when said cover is attached to said remote control; and a fastener which removably attaches said cover to said remote control, wherein said fastener is disposed between said front surface of said remote control and said cover and has a thickness corresponding to a height said buttons project from said front surface sufficient to prevent said cover from activating said buttons when cover is attached to said remote control.

2. A device according to claim 1, wherein said cover is formed of a single piece of rigid material.

3. A device according to claim 1, wherein said fastener is disposed on said front surface of said remote control, said device further comprising a spacer interposed between said fastener and said front surface which further insures a clearance of at least a height said buttons project from said front surface of said remote control between said front surface and said cover when said cover is attached to said remote control.

4. A device according to claim 1, wherein the outer dimensions of said front surface of said remote control and said cover are the same.

5. A device according to claim 2, wherein said rigid material is stainless steel.

6. A device according to claim 1, wherein said buttons are arranged in rows and columns and wherein said second set of buttons includes buttons which are not all contained in a single row or column.

7. A device according to claim 1, wherein said fastener is a pair of mutually engageable hook and loop fabric strips.

8. A device according to claim 3, wherein said fastener is a pair of mutually engageable hook and loop fabric strips.

9. A device according to claim 1, wherein said remote control functions control a single electronic appliance, and wherein said second set of said buttons access a basic set of said remote control functions.

10. A device according to claim 9, wherein said fastener is a pair of mutually engageable hook and loop fabric strips.

11. A device according to claim 1, wherein said fastener prevents relative movement between said cover and said remote control so that said first set of buttons remain covered and said second set of buttons remain exposed at all times when said cover is attached to said remote control.

12. A device which is adapted for use in a remote control having a plurality of buttons for accessing remote control functions which control a single electronic appliance, said device comprising:

a cover which is adapted to allow depression of a first set of said buttons for accessing a basic set of said remote control functions and to prevent depression of a second set of said buttons different than said first set when said cover is attached to said remote control; and a fastener which removably attaches said cover to said remote control, wherein said fastener is disposed between a front surface of said remote control and said cover and has a thickness corresponding to a height said buttons project from said front surface sufficient to prevent said cover from activating said buttons when said cover is attached to said remote control.

13. A device according to claim 12, wherein the outer dimensions of said remote control and said cover are the same.

14. A device according to claim 12, wherein said buttons are arranged in rows and columns and wherein said first set of buttons includes buttons which are not all contained in a single row or column.

15. A device according to claim 12, wherein said electronic appliance is a television and wherein said basic set of said remote control functions includes a power on/off function, channel up/down functions and volume up/down functions.

16. A device according to claim 12, wherein said electronic appliance is a stereo and wherein said basic set of said remote control functions includes a power on/off function, program/channel up/down functions and volume up/down functions.

17. A device according to claim 12, wherein said electronic appliance is a VCR and wherein said basic set of said remote control functions includes a power on/off function, a play function, a stop function, a fast-forward function, and a rewind function.

18. A device according to claim 12, wherein said fastener prevents relative movement between said cover and said remote control so that said first set of buttons remain exposed and said second set of buttons remain covered at all times when said cover is attached to said remote control.

19. A method for providing selective access to remote control functions comprising:

identifying a remote control having a plurality of buttons for accessing said remote control functions, said buttons disposed on a front surface of said remote control having a predetermined shape; and forming a cover having a shape substantially corresponding to said shape of said front surface remote control and which is adapted to prevent depression of a first set of said buttons and to allow depression of a second set of said buttons different than said first set; and providing a fastener between said front surface of said remote control and said cover which removably attaches said cover to said remote control and which has a thickness corresponding to a height said buttons project from said front surface sufficient to prevent said cover from activating said buttons when said cover is attached to said remote control.

20. A method according to claim 19, further comprising a step of removably attaching said cover to said remote control.

21. A method according to claim 20, wherein said buttons project a height from said front surface of said remote control and wherein said removably attaching step includes maintaining a clearance of at least said predetermined height of said buttons between said front surface of said remote control and said cover.

22. A method according to claim 19, wherein said forming step includes forming said cover such that the outer dimensions of said front surface of said remote control and said cover are the same.

23. A method according to claim 20, wherein said forming step includes forming said cover such that the outer dimensions of said front surface of said remote control and said cover are the same and wherein said removably attaching step includes aligning edges of said cover with said remote control.

24. A method according to claim 19, wherein said buttons are arranged in rows and columns and wherein said forming step includes forming exposing portions in said cover which are adapted to expose said second set of buttons including buttons which are not all contained in a single row or column.

25. a method according to claim 19, wherein said remote control functions control a single electronic appliance, and wherein said second set of said buttons access a basic set of said remote control functions.

26. A method according to claim 19, further comprising a step of providing a fastener which removably attaches said cover to said remote control and which prevents relative movement between said cover and said remote control so that said first set of buttons remain covered and said second set of buttons remain exposed at all times when said cover is attached to said remote control.

27. A method according to claim 24, wherein said buttons are arranged in rows and columns and wherein said forming step includes forming exposing portions in said cover which are adapted to expose said first set of buttons including buttons which are not all contained in a single row or column.

28. A method according to claim 27, further comprising a step of removably attaching said cover to said remote control.

29. A method according to claim 28, wherein said forming step includes forming said cover such that the outer dimensions of said remote control and said cover are the same and wherein said removably attaching step includes aligning edges of said cover with said remote control.

30. A method according to claim 27, wherein said buttons are arranged in rows and columns and wherein said forming step includes forming exposing portions in said cover which are adapted to expose said first set of buttons including buttons which are not all contained in a single row or column.

31. A method according to claim 27, wherein said electronic appliance is a television and wherein said basic set of said remote control functions includes a power on/off function, channel up/down functions and volume up/down functions.

32. A method according to claim 27, wherein said electronic appliance is a stereo and wherein said basic set of said remote control functions includes a power on/off function, program/channel up/down functions and volume up/down functions.

33. A method according to claim 27, wherein said electronic appliance is a VCR and wherein said basic set of said remote control functions includes a power on/off function, a play function, a stop function, a fast-forward function, and a rewind function.

34. A method according to claim 27, further comprising a step of providing a fastener which removably attaches said cover to said remote control and which prevents relative movement between said cover and said remote control so that said first set of buttons remain exposed and said second set of buttons remain covered at all times when said cover is attached to said remote control.

* * * * *